United States Patent [19]

Mead et al.

[11] Patent Number: 4,935,702
[45] Date of Patent: Jun. 19, 1990

[54] SUBTHRESHOLD CMOS AMPLIFIER WITH OFFSET ADAPTATION

[75] Inventors: Carver A. Mead, Pasadena; Timothy P. Allen, Palo Alto, both of Calif.

[73] Assignee: Synaptics, Inc., San Jose, Calif.

[21] Appl. No.: 282,176

[22] Filed: Dec. 9, 1988

[51] Int. Cl.[5] .............................................. H03F 3/45
[52] U.S. Cl. ........................................ 330/9; 330/253;
330/261; 330/264; 330/307; 330/308; 357/23.5
[58] Field of Search ...................... 330/9, 59, 253, 261,
330/264, 307, 308; 357/23.5

[56] References Cited

U.S. PATENT DOCUMENTS 4,665,426 5/1987 Allen et al. ..................... 357/23.5 X

OTHER PUBLICATIONS

Glasser, Lance A., "A UV Write-Enabled PROM," 1985 *Chapel Hill Conference on Very Large Scale Integration*, Ed. H. Fuchs, Computer Science Press, pp. 61–65.

*Primary Examiner*—James B. Mullins
*Attorney, Agent, or Firm*—Lyon & Lyon

[57] ABSTRACT

An integrated circuit amplifier having a random input offset voltage is adaptable such that the input offset voltage may be cancelled out. An input node is a floating input node and is coupled to a source of input signal by a first capacitor. A second capacitor is connected between the output of the amplifier and the floating node. An ultraviolet window above the second capacitor allows the floating node to be charged, by the application of ultraviolet light, to a voltage which effectively cancels the input offset voltage.

19 Claims, 5 Drawing Sheets

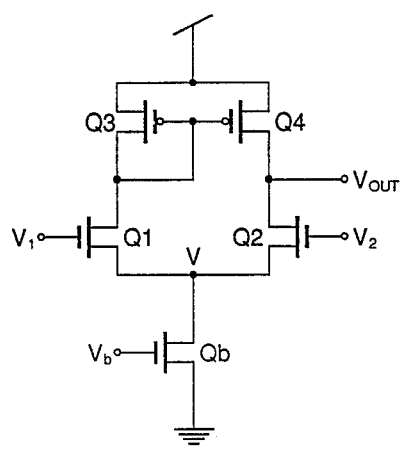
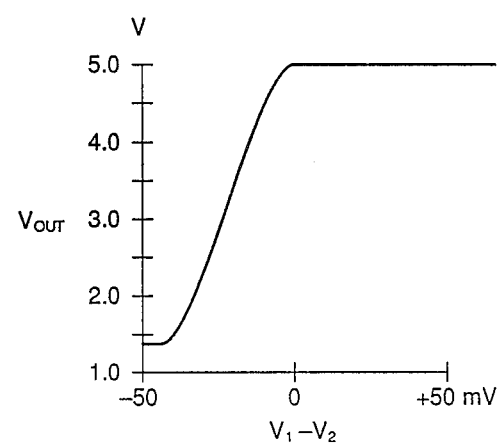
FIGURE 1A  
PRIOR ART
FIGURE 1B
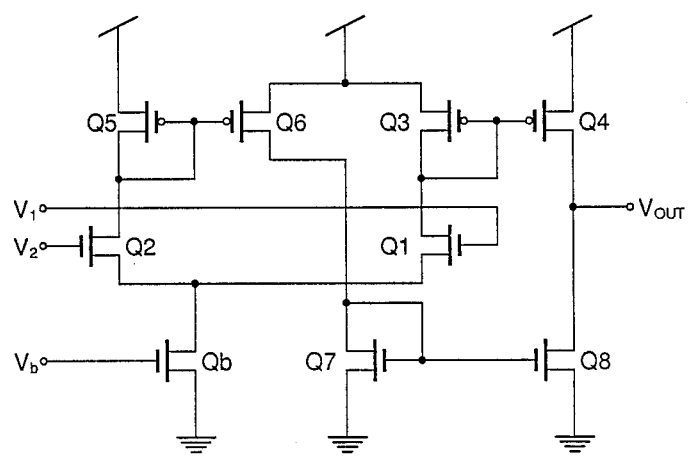
FIGURE 1C  
PRIOR ART
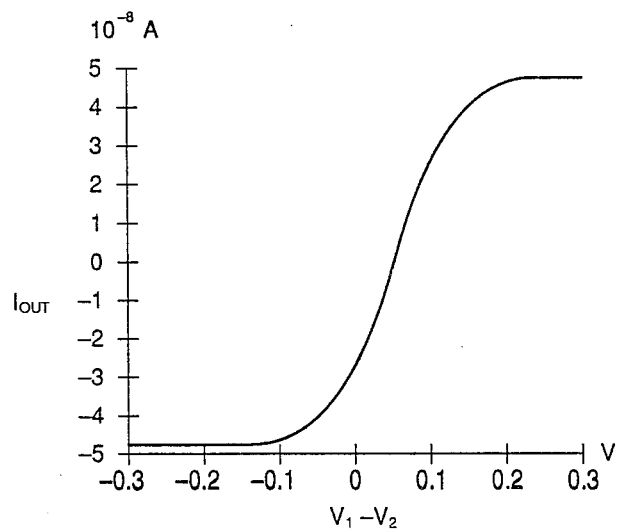
FIGURE 1D

SUBTHRESHOLD CMOS AMPLIFIER WITH OFFSET ADAPTATION

BACKGROUND OF THE INVENTION

1. Field Of The Invention

The present invention relates to electronic circuits. More specifically, the present invention relates to adaptive circuits.

2. The Prior Art

It has recently become apparent that large-scale analog circuits can be achieved using conventional CMOS technology. The key to achieving very high levels of complexity in an analog system is to operate the individual transistors in their subthreshold region, where the drain current is an exponential function of the gate-source voltage. In this regime of operation, amplifiers can be operated with current levels in the range from $10^{-12}$ A to $10^{-7}$ A. At these low currents, the drain current of the individual transistors saturates at drain voltages above 100 to 200 mV, allowing analog operation with the same power-supply voltages commonly employed for digital circuits (0–5V in 1988). Because of the low power-supply voltage and low current level, the total power dissipated by an individual amplifier is extremely small, making possible large-scale systems employing $10^4$ or more amplifiers.

Despite the numerous advantages of subthreshold operation, very few systems outside of the electronic watch industry have taken advantage of this mode of operation. The major problems that have prevented application of subthreshold amplifiers have been their input offset voltage and the limited input voltage range.

BRIEF DESCRIPTION OF THE INVENTION

The present invention addresses both the input range and input offset problems, and makes possible the adaptation of subthreshold CMOS technology to a much wider range of applications.

An analog MOS integrated circuit comprises an amplifier circuit having a gain much larger than 1. The input into one stage of this amplifier circuit is a floating node forming the gate of at least one MOS transistor. A first capacitor couples an input of the circuit to this floating node and a second capacitor is connected from an output of the amplifier to this floating node. A window or opening in the metal layers above the second capacitor allows ultraviolet light to fall onto both electrodes of the capacitor, thus allowing the offset voltage of the amplifier to be adapted while the source of ultraviolet light is present.

BRIEF DESCRIPTION OF THE DRAWINGS

FIGS. 1a–1d are schematic diagrams and transfer curves of prior art CMOS transconductance amplifiers.

FIG. 4b is a top view of a typical layout for the circuit depicted in FIG. 4a.

DETAILED DESCRIPTION OF A PREFERRED EMBODIMENT

Figure 2:
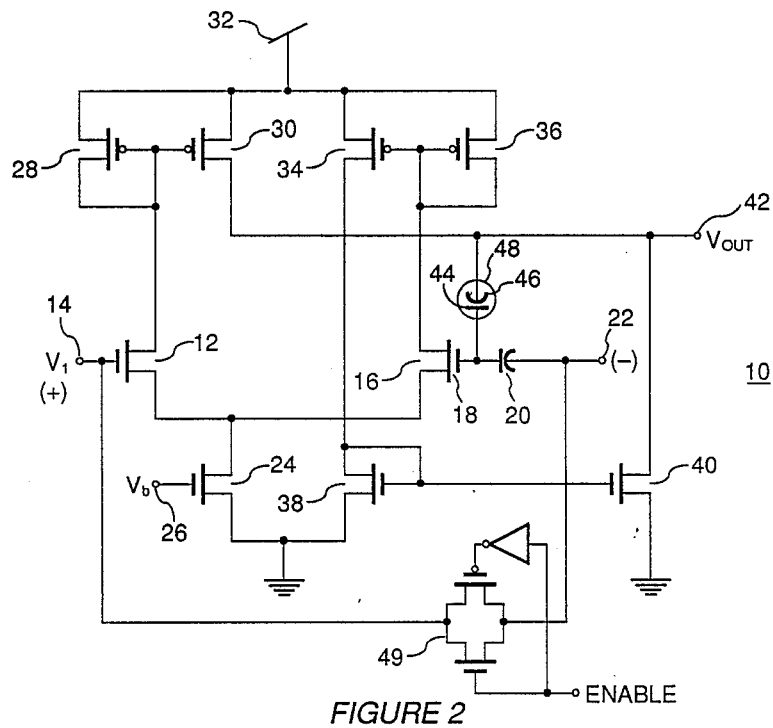
FIG. 2 is a schematic diagram of a presently-preferred embodiment of a CMOS subthreshold amplifier with automatic offset adaptation according to the present invention.

Referring first to FIG. 1a, a typical CMOS transconductance amplifier as known in the prior art is shown. FIG. 1b is a transfer curve for the amplifier circuit of FIG. 1a. FIG. 1b illustrates a typical input-offset voltage condition which is characteristic of the amplifier FIG. 1a. Note that when $V_1 = V_2$, the output of the amplifier is at a voltage of 5 volts, equal to the voltage on one of the power supply rails. As shown in FIG. 1b, the active region of the amplifier lies in the region where the input voltage $V_1-V_2$ is the range from about 50 millivolts to zero. Those of ordinary skill in the art will readily recognize that, depending on the particular offset voltages of the individual transistors, the transfer curve of FIG. 1b for any given amplifier could be shifted to either the right or the left on the X axis of FIG. 1b.

Those of ordinary skill in the art will also recognize that the circuit of FIG. 1 suffers from another drawback. That is, when the voltage $V_{out}$ is less than the voltage V, the transistor $Q_2$ will stop conducting and the output voltage will no longer be a function of the differential input voltage.

The circuit of FIG. 1c, also known in the prior art, is meant to overcome the difficulty mentioned with respect to the circuit of FIG. 1a. In the circuit of FIG. 1c, the current mirror comprising $Q_3$ and $Q_4$. and the current mirror comprising $Q_5$ and $Q_6$ isolate the output stages from the input stages, thus allowing the output voltage to be free of the dependence on the input voltage exhibited by the circuit of FIG. 1a.

The circuit of FIG. 1c also suffers from the input offset voltage problem noted with respect to the circuit of FIG. 1a. This may be seen by examination of FIG. 1d, a typical transfer curve of the circuit shown in FIG. 1c. It will be observed that the linear portion of the transfer curve ($I_{out}$ vs $V_{in}$) is not symmetrical about the $V_1 = V_2$. position on the curve. For any individual amplifier circuit, the transfer curve of FIG. 1d may be located at different positions along the X axis due to the random offset voltage inherent in each circuit as a result of its manufacture. Because of the input offset voltage, the amplifier has an output current when the input voltage difference is zero. Since these amplifiers are often used as differential amplifiers, where they are connected so as to utilize the output current as a measure of the input voltage difference, it is clear that the offset voltage prevents the amplifier from operating as intended.

Those of ordinary skill in the art will note that a third drawback, common to the circuits of FIGS. 1a and FIG. 1c, is that the range of input voltages for which the output transfer function is approximately linear is very small. When used as either a voltage output device, or a current output device, as shown in FIG. 1d, the range of output voltage for which the transfer function is approximately linear is restricted to a range of differential input voltage less than 200 millivolts. This factor, coupled with the random input offset voltage exhibited by the circuits of FIG. 1a and 1c, severely restricts the applications to which such circuits may be put. When used as a voltage output device, the range of operation is even smaller (FIG. 1b).

The present invention provides a solution to the input offset voltage problem, the inherently limited input voltage swing drawback, and the limited input voltage range inherent in the prior art transconductance amplifier circuits operating in subthreshold regions.

Referring now to FIG. 2, a presently-preferred embodiment of a subthreshold CMOS transconductance amplifier according to the present invention is shown. Subthreshold CMOS transconductance amplifier 10 includes a first N-channel MOS input transistor 12 having its gate connected to a non-inverting input node 14 and a second N-channel MOS input transistor 16 having its gate 18 connected through a capacitor 20 (referred to in equations herein as "C20") to an inverting input node 22. Capacitor 20 is formed by the gate 18 second N-channel MOS input transistor, which is an electrically-isolated, or "floating" gate, formed by a first polysilicon layer, and a second polysilicon layer connected to inverting input node 22. A silicon dioxide insulating layer forms the preferred dielectric of capacitor 20 between the first and second polysilicon layers which form the plates of the capacitor.

The sources of first N-channel input transistor 12 and second N-channel input transistor 16 are commonly connected to the drain of an N-channel transistor 24 having its gate connected to a bias input node 26. The drain of first N-channel input transistor 12 is connected to a first current mirror consisting of first P-channel current mirror transistor 28 and second P-channel current mirror transistor 30. The gates of P-channel current mirror transistors 28 and 30 are commonly connected to the drain of first N-channel input transistor 12 and to the drain of first P-channel current mirror transistor 28. The sources of P-channel current mirror transistors 28 and 30 are commonly connected a source of positive voltage $V_{dd}$, shown at reference numeral 32.

The drain of second N-channel input transistor 16 is connected to a second current mirror consisting of third and fourth P-channel current mirror transistors 34 and 36, respectively. The gates of third and fourth P-channel current mirror transistors 34 and 36 are commonly connected to the drain of first N-channel input transistor 16 as well as to the drain of fourth P-channel current mirror transistor 36. The sources of third and fourth P-channel current mirror transistors 34 and 36 are commonly connected to $V_{dd}$. The drain of third P-channel current mirror transistor 34 is connected to the gate and drain of N-channel transistor 38. The source of N-channel transistor 38 as well as the source of N-channel transistor 24 are commonly connected to a source of negative voltage $V_{ss}$, shown as ground in FIG. 2.

N-channel transistor 38 and N-channel transistor 40 form a third current mirror. The gate of N-channel transistor 40 is connected to the gate of N-channel transistor 38. The source of N-channel transistor 40 is connected to the source of negative voltage $V_{SS}$, shown as ground in FIG. 2. The drain of N-channel transistor 40 is connected to the drain of N-channel current mirror transistor 30 forming the output node 42 of amplifier 10.

The floating gate 18 of second N-channel input transistor 16 forms a capacitor plate 44 of capacitor 46, the other plate being formed by or connected to the diffused regions which form the drains of N-channel transistor 40 and P-channel transistor 30 and the contacts and metal layers which connect them together, at the output node 42 of the transconductance amplifier 10. An ultraviolet "UV" window 48 formed in an otherwise opaque second metal layer lies above the capacitor plate 44. This UV window will be further described with respect to FIG. 3.

The circuit of the preferred embodiment of the present invention shown in FIG. 2. is identical to the circuit shown in FIG. 1c, except that $Q_2$ transistor 16 has a floating gate, and is coupled only by capacitor 20 to the negative input node 22, $V_2$, and by capacitor 46 to the output node 42, $V_{out}$. For ease of analysis, it is first assumed that there are no offset voltages in the circuit, and that when $V_1$ and $V_2$ are fixed at a voltage $V_0$, $V_{out}$ is also $V_0$. In the analysis, all voltages will be referenced to $V_o$. As the positive input voltage $V_1$ is increased from $V_0$, the output voltage will increase due to the gain A of the amplifier according to equation [1] where $V_f$ is the voltage on the floating gate 16:

$$V_{out} = A(V_1 - V_f) \quad [1]$$

This increase in output voltage will induce a charge on capacitor 46 (referred to in equations herein as "C46"), thus increasing the voltage $V_f$ on the floating gate. The charge relationships in the circuit are:

$$C_{46}(V_{out} - V_f) = C_{46}(V_f - V_2) \quad [2]$$

Eliminating $V_f$ from equations [1] and [2], yields:

$$V_{out}[1 + (1/A)(1 + C_{20}/C_{46})] = V(1 + C_{20}/C_{46}) - V_2 C_{20}/C_{46} \quad [3]$$

When A is very large compared to $C_{46}/C_{20}$, the overall gain of the amplifier with this arrangement becomes independent of A, as is well known from the feedback amplifier art. Under these conditions, the amplifier becomes very linear, and its gain is set by the values of the two capacitors 46 and 20, which employ the silicon oxide dielectric between two layers of polysilicon. Because this oxide is thermally grown at a high temperature in a typical CMOS process, its properties are among the best controlled parameters in the entire process. The areas of the capacitors can be controlled by the area of one of the layers, and thus can be made independent of the alignment between layers. The floating-gate feedback-controlled amplifier is thus an ideal match to the capabilities of the CMOS technology.

Those skilled in the art will notice that FIG. 2 is an amplifier with a capacitive divider circuit on the inverting input. Amplifiers of this type, with capacitively coupled inputs, are used widely in applications where only the AC (high-frequency) components of the input signal are passed through the capacitive divider and amplified. If this capacitive divider is implemented on a MOS integrated circuit using a thermally-grown oxide layer as the dielectric of the capacitors $C_{20}$ and $C_{46}$, then DC signals, as well as AC signals, will be passed through this divider circuit. This is because the characteristic cutoff frequency of the input divider stage (the frequency below which the network sharply attenuates the inputs) is determined by the size of the two capacitors in relation to the size of any current paths (resistances, current sources, etc. . . . ) connected to the center node of the divider circuit. Since the center node of this circuit is imbedded in thermally-grown oxide, which permits no charge whatsoever to leave this node, there are no current paths connected to this node. This means that the cutoff frequency is zero, and the formula commonly used to describe the capacitive voltage divider for AC signals:

$$V_{out} = V_{in} \frac{C_1}{C_1 + C_2}$$

holds for DC voltages as well. In short, this AC-coupled amplifier, when implemented as a MOS integrated circuit, will work as a DC amplifier as well.

This arrangement has not been widely used because the floating gate potential is not well controlled. Using the techniques of the present invention, the floating gate potential can be precisely set.

Figure 3A:
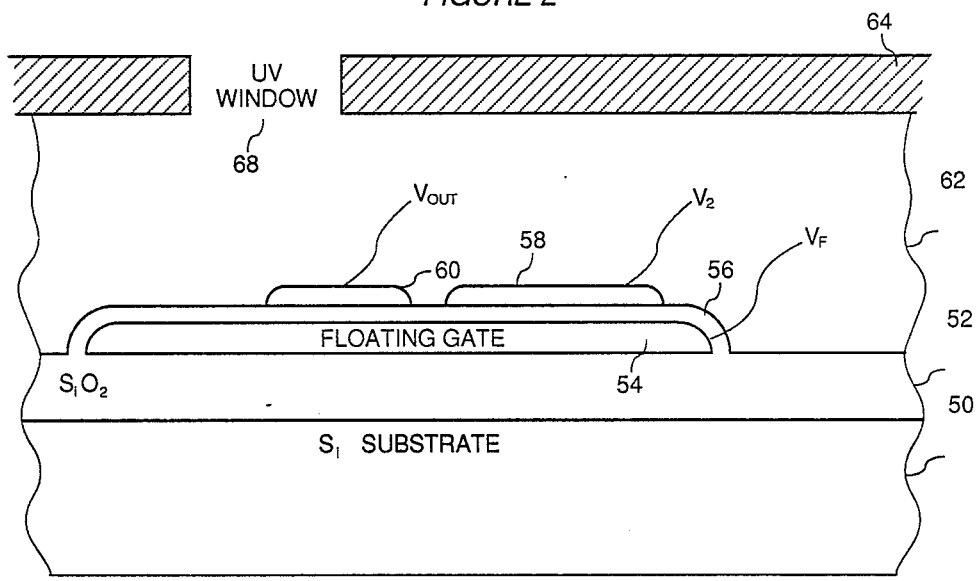
FIGS. 3a and 3b are a cross-sectional view and a top view, respectively, of a portion of the circuit of FIG. 2, showing the location of the floating gate capacitors and the ultraviolet window.

Referring now to FIG. 3a, a cross sectional view of the semiconductor structure of the portion of FIG. 2 in the region of the floating gate is shown. This circuit may be fabricated utilizing conventional CMOS fabrication techniques, well understood by those of ordinary skill in the art. The entire circuit is fabricated on silicon substrate 50, in which n-type regions are diffused to form the sources and drains of the N-Channel devices and n-wells are formed into which p-type diffusion regions are formed to form the sources and drains of the P-channel devices.

The surface of the silicon substrate 50 is covered with a layer of oxide 52 in a conventional manner. A first layer of polysilicon is deposited on top of the silicon dioxide layer 52 and then defined using conventional deposition, masking, and etching techniques to form floating gate 54. Once floating gate 54 has been formed a second layer of oxide 56 is grown over floating gate 54. A second layer of polysilicon is then deposited on top of oxide layer 56 and formed into regions 58 and 60 using conventional deposition, masking, and etching techniques.

Region 58 forms one of the plates of capacitor 20 of FIG. 2 and region 60 is connected to output node 42 (FIG. 2) via a metal contact. After second level polysilicon regions 58 and 60 have been defined, another insulating layer 62 is deposited over the second polysilicon layer. A first metal layer (not shown), for use as interconnections as is well understood by those of ordinary skill in the art, is next deposited and defined. After deposition of another insulating layer above the first metal layer, a second metal layer 64 is deposited and UV windows 68 are etched into the second metal layer 64. The UV windows are centered directly above the edge of the upper second polysilicon region 60, which is connected to the output node 42. Second level metal layer 64 should be connected to a fixed potential, preferably ground or $V_{dd}$.

It is important that the UV coupling exist only to the node which is fed back from the output, and not to other extraneous voltages which would cause error. Therefore, it is important to avoid coupling the floating node to unwanted voltage. It is also important that the opaque layer cover all active circuit areas which would otherwise be affected by the presence of UV light.

Figure 3B:
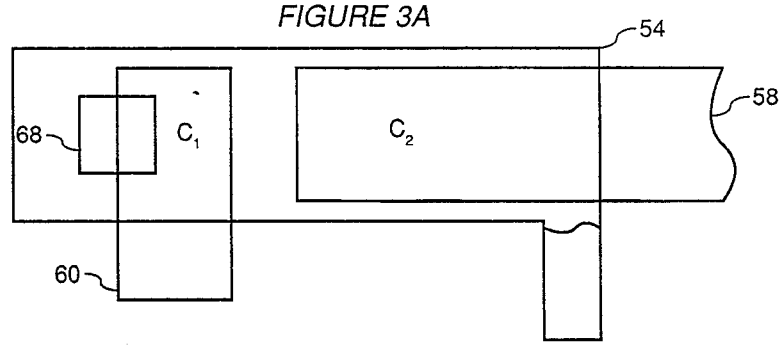

FIG. 3b is a top view of the structure shown in FIG. 3a. In FIG. 3b the spatial relationship between floating gate 54 and second level polysilicon regions 58 and 60 and ultraviolet window 68 can be more easily seen.

Those of ordinary skill in the art will readily recognize that additional geometry within the circuit layout may be used to form and/or enhance these capacitances. The placement of these capacitors is thus a design choice within the skill of one of ordinary skill in the art.

A key feature of the present invention is that the effect of offset voltages can be nulled out using the circuit structure shown in FIG. 2. In order to null the offset voltage of the amplifier of FIG. 2, the circuit is biased to the current where it will be operated, and the two inputs, nodes 14 and 22, are connected together to a source of voltage in the range where the circuit will be operated.

A means must be provided for forming this connection, and can be, for example, an analog pass gate, well known in the art. Referring again to FIG. 2, pass gate 49 is shown connected between noninverting input node 14 and inverting input node 22. Pass gate 49 is a conventional pass gate consisting of a P-channel MOS transistor and an N-channel MOS transistor connected in parallel. An enable signal is connected directly to the gate of the N-channel MOS transistor and is connected through an inverter to the gate of the P-channel MOS transistor. A suitable enable signal is provided to pass gate 49 when it is desired to connect noninverting input node 14 to inverting input node 22 in accordance with the procedure described herein.

Once nodes 14 and 22 have been connected together, the chip is then exposed to a source of UV photons of energy greater than 3.2 electron-volts. This energy is sufficient to excite electrons from the capacitor plates into the conduction band of the silicon dioxide insulator. This mechanism of electron excitation is well known, and is used to erase the charge on the floating gates of logic transistors in programmable read-only memories.

In the circuit of FIG. 2, the UV excited electrons flow from the most negative plate of $C_{46}$ to the most positive plate. By the negative feedback action of the amplifier, the output is driven to a voltage which is very close to the value of $V_2$ and $V_1$. Once the offset voltage has been thus nulled, the two inputs can be disconnected from the voltage source in order that the amplifier can be used in a true differential mode; it will have its offset greatly reduced. This technique thus allows the construction of practical analog circuits operating at micropower levels on low power-supply voltages.

The amplifier in the circuit of the present invention need not be a differential amplifier. In an alternate embodiment, shown in FIG. 4a, an amplifier is formed by two transistors connected as an ordinary CMOS inverter. The common gate of the upper and lower transistors is a floating gate, and is capacitively coupled to the input through a first capacitor and to the output through a second capacitor.

The inverter is operated with a low voltage supply (1-2 volts) to insure subthreshold operation. In order to null the offset of this amplifier, the input is set to some reference potential $V_{ref}$. When UV illumination is applied, the output is coupled to the input, and output voltage tends to stabilize at the crossover point, i.e., the point at which the output voltage equals the input voltage. This balanced voltage $V_{inv}$, the voltage at which this occurs, will be approximately midway between the positive and negative power supply rails, in the region of high gain for the amplifier. Once the amplifier is thus adapted, the output voltage will be defined as:

$$V_{out} = V_{inv} + A \, (V_{in} - V_{ref}) \qquad [5]$$

After adaptation, the output of the circuit will be $V_{inv}$ (the inverter crossover voltage) when the input voltage is $V_{ref}$.

Figure 4A:
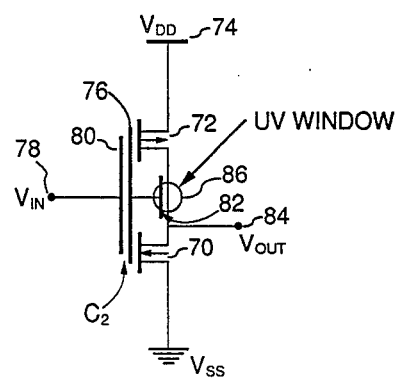
FIG. 4a is a schematic diagram of an alternate embodiment of the present invention wherein the amplifier is a simple inverter.

Referring now to FIG. 4a, an N-channel transistor 70 has its source connected to a source of negative potential (shown as ground in FIG. 4a) and its drain connected to the drain of a first P-channel transistor 72. The source of P-channel transistor 72 is connected to a source of positive voltage $V_{dd}$, shown at reference numeral 74. Floating gate 76 is common to both N-channel transistor 70 and P-channel transistor 72. Floating gate 76 is coupled to an input node 78 by a first capacitor, one plate of which is floating gate 76 and the other plate of which is shown at reference numeral 80. A region 82 of floating gate 76 forms one plate of a second capacitor. The other plate of the second capacitor is formed by the output node 84 of the circuit. An ultraviolet window 86 is located above this second capacitor.

Figure 4B:
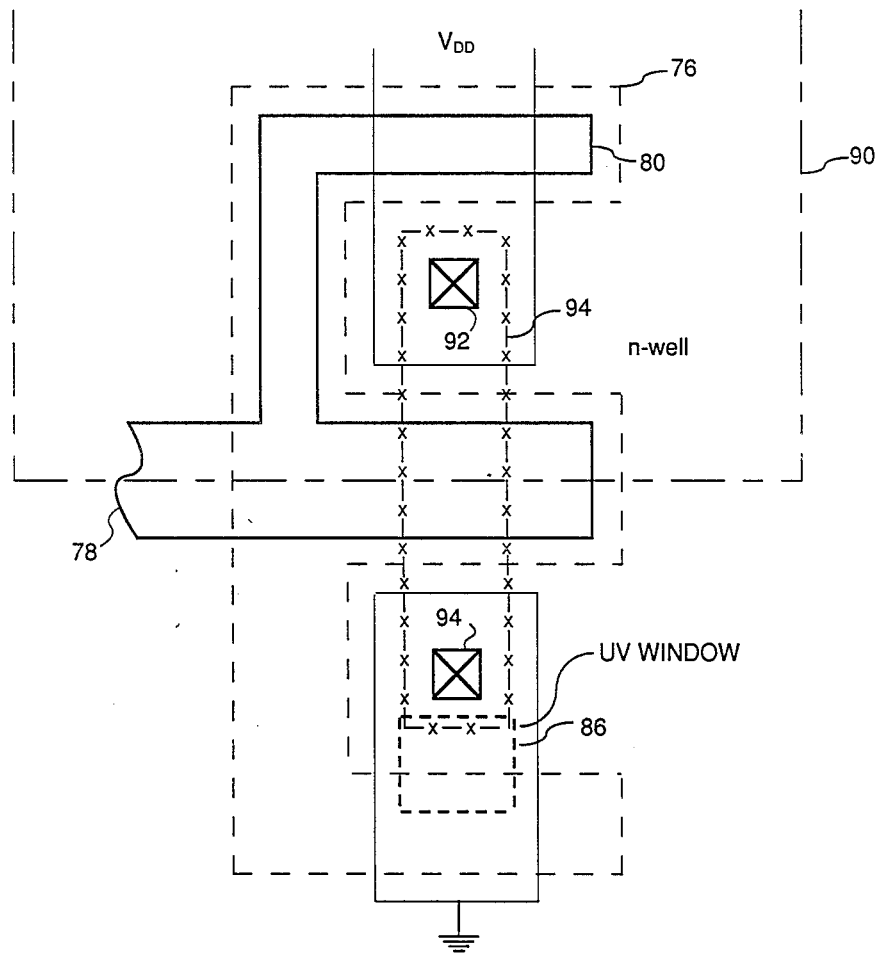

The circuit of FIG. 4a may be further understood with reference to FIG. 4b, a top view of a typical physical layout of the circuit of FIG. 4a. P-channel transistor 72 is formed in n-well 90. The top leg of floating gate 76 and capacitor plate 80, which is connected to input node 78, form the gate for the P-channel transistor 72. A metal contact 92 connects the drain diffusion of P-channel transistor 72 to a portion 94 of the metal layer which is in turn connected, via a contact 96, to the drain diffusion of N-channel transistor 70. The lower leg of floating gate 76 forms the gate for N-channel transistor 70.

The first capacitor is formed by the entirety of floating gate 76 and the entirety of capacitor plate 80. The second capacitor consists of several parasitic elements, including the inherent capacitance between metal layer 94 and the floating gate and the inherent capacitance between the drain diffusions of N-channel transistor 70 and P-channel transistor 72 and the floating gate. Ultraviolet window 86 is preferably placed over the portion of the second capacitor where the drain diffusion of N-channel transistor 70 meets the floating gate.

The circuits of FIGs. 1a and 1c, are also often used as transconductance amplifiers, in which the output current is employed rather than the open-circuit output voltage. The measured current-transfer characteristic of the hyperbolic tangent, and the useful range of input voltage difference over which the output current is affected by the input, is only about plus and minus 100mV. More important, the input offset voltage is an appreciable fraction of the entire effective input voltage range. For this reason, the applications in which the amplifier can be used are extremely limited. Although the data shown are from the circuit of FIG. 1a, curves from the circuit of FIG. 1c are similar, except the output voltage range is wider. For that reason, the circuit of FIG. 1c is to be preferred where space permits. Both of these circuits are well known in the prior art.

Figure 5A:
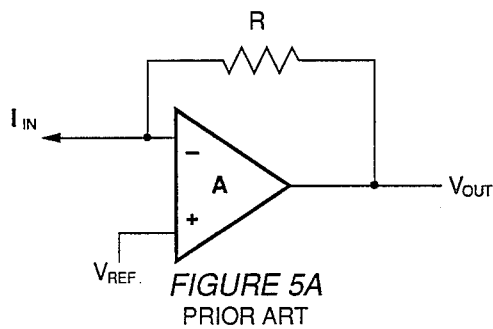
FIGS. 5a–b are block diagrams of prior art transconductance amplifiers.

In circumstances where the output voltage will remain fixed, the feedback capacitance from the output to the inverting input node can be supplemented by a capacitance to either the non-inverting input or to a low impedance source of a fixed potential. Thus capacitance, with the input capacitance, forms a capacitance voltage divider, thereby reducing the effect of the input voltage difference and thus expanding horizontal scale of the curve of FIG. 1d. This expansion has the effect of providing a wider linear input range which can be used to minimize or eliminate the effects of the saturation of the output current. The reason why this has not been done previously is that the voltage on the floating node has not been well controlled and the input offset voltage would be larger than the achievable range of input voltage variation; thus the output current would be saturated. Using the teachings of the present invention, this difficulty is overcome by open circuiting the output of the amplifier and adapting the voltage on the floating node as previously described. Once the voltage on this node is adapted, the output can be reconnected and the amplifier used as a highly linear voltage-to-current converter with low offset. These principles just described can be used in a current-sense amplifier. The purpose of current sense amplifier circuits is to generate an output voltage $V_{out}$ proportional to the input current $I_{in}$. In the prior art, this function would be accomplished using the circuit of FIG. 5a. Assuming a perfect amplifier with voltage gain A >> 1, the output of the circuit is $$V_{out} = V_{ref} + R\, I_{in} \qquad [6]$$

For small values of $I_{in}$, this circuit has many drawbacks for production implementation in a standard CMOS process. Resistive material for making precision resistors is not available in most processes. Even if a resistive layer were available, the feedback resistor R would be of a fixed value, and could not be adjusted during operation to match the range of currents to be sensed, which can vary over many orders of magnitude.

Figure 5B:
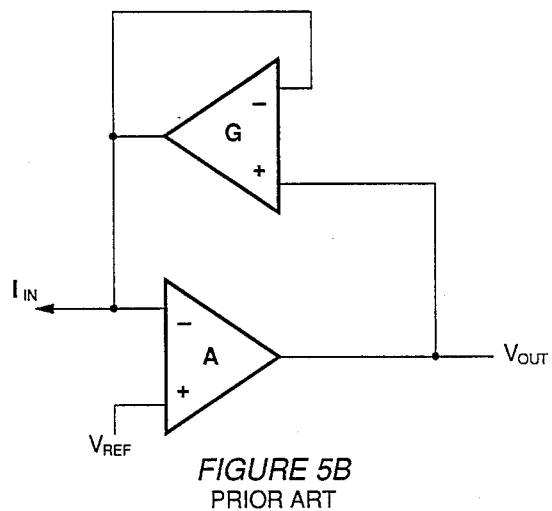

In order to achieve a feedback element capable of having its value adjustable over many orders of magnitude, follower-connected transconductance amplifier known in the prior art, as shown in FIG. 5b may be used. The amplifier labeled G has a current output dependent upon voltage difference between output and input node according to the relationship shown in FIG. 1d. The current scale can be adjusted over orders of magnitude by setting the bias control Vb of the G amplifier. The problem with this circuit is that the output voltage range is limited to plus or minus ~100 mV for the linear range of operation. If a current is sensed which is greater than the bias current in the G amplifier, the current output of the G amplifier will saturate and $V_{out}$ will slam against one of the power-supply rails. $V_{out}$ is thus not a well-behaved function of $I_{in}$.

Figure 5C:
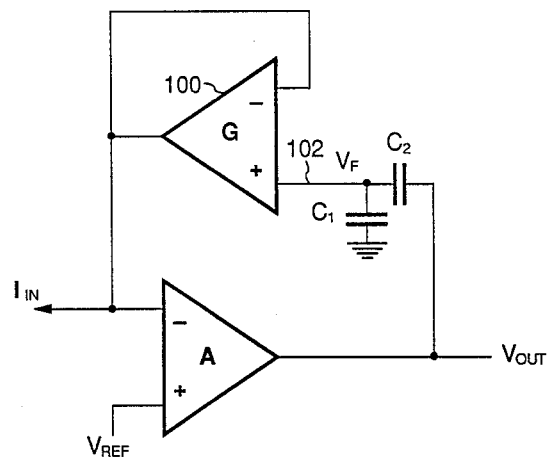
FIGS. 5c–d are block diagrams of transconductance amplifiers which are suitable for use in the present invention.

In order to overcome the current-saturation behavior of the G amplifier, a capacitive voltage divider may be used, as shown in FIG. 5c, to reduce the input voltage range of amplifier 100 according to the present invention. This arrangement has the effect of spreading the voltage range of the tanh characteristic of FIG. 1d by the factor $(C_1+C_2)/C_2$. The problem with this circuit is, of course, that the input offset voltage of the G amplifier may saturate the amplifier at maximum output current, independent of $V_{out}$.

In order to compensate the effects of offset voltage, the same technique which is used in FIG. 2 may be used. The input node $V_f$ (reference numeral 102) to the G amplifier is a floating node, and can be adapted with UV light to compensate out the offset voltage of the G amplifier. A UV window structure similar to that shown in FIG. 3 over the $C_2$ capacitor must be provided. By setting the input current to zero and exposing the circuit to UV light, the output voltage can be driven to $V_{ref}$ (within one offset voltage of the A amplifier). The same technique with more complex switching schemes can also be a amplifier as well.

Figure 5D:
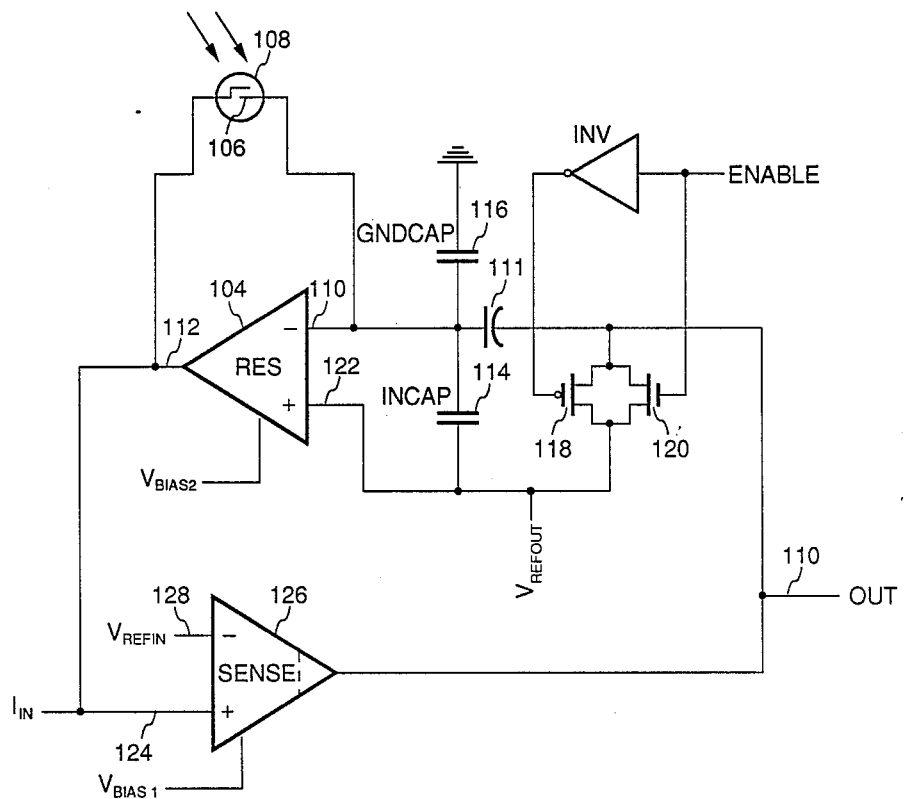

In order to further reduce the effects of input offset voltage, the circuit of FIG. 5d may be used.

The adaptable amplifier 104 has a capacitor 106 with overlying UV window 108 in an otherwise opaque layer connected between its inverting input 110 and its output 112. Capacitor 111 makes inverting input 110 a floating node. Capacitor 114 between the inverting and noninverting input, and capacitor 116, between the inverting input and ground, form an input voltage divider to set the input range. The output 112 of amplifier 104 is connected to the noninverting input 124 of amplifier 126. The inverting input 128 of amplifier 126 is connected to a source of reference voltage $v_{refin}$. Those of ordinary skill in the art will notice that, in the circuit of FIG. 2, a conventional passgate, comprising P-channel transistor 118 and N-channel transistor 120 is connected between the inverting input 110 and noninverting input 122.

In the circuit of FIG. 5d, the gain of amplifier 104 further reduces the input offset. In the circuit of FIG. 5d, the voltage ($V_{refin}$) at the inverting input 128 to amplifier 126 is chosen to be the voltage at which it is desired that the noninverting input of that amplifier 124 should be set. The $V_{bias\,1}$ input sets the current drive capability for driving the output node 124. The $V_{bias2}$ voltage sets the slope of the current output of the amplifier, as is shown in graph of FIG. 1b, by setting the vertical axis scale. The voltage $V_{refout}$ sets the quiescent point for $V_{out}$.

The ratio of capacitors 106, 114 and 116 to capacitor 111 sets the gain of the amplifier and, by setting the ratio, the linear range of operation may be altered. For example, if a 100 mv input voltage range will saturate the output at both power supply rails, a ratio of 50:1 will expand the input range to 5 volts.

While presently-preferred embodiments of the present invention have been disclosed herein, those of ordinary skill in the art will be enabled, from the within disclosure, to configure embodiments which although not expressly disclosed herein nevertheless fall within the scope of the present invention. It is therefore, the intent of the inventors that the scope of the present invention be limited only by the appended claims.

What is claimed is:

1. An analog MOS inverting amplifier fabricated as a part of an integrated circuit, said amplifier having a gain of magnitude much larger than 1, including:
    an output node,
    an inverting input node, said input node being a floating node forming the gate of at least one MOS transistor,
    a first capacitor for coupling an input to said circuit to said floating node,
    a second capacitor connected from said output node to said floating node,
    an opaque layer covering portions of the surface of said integrated circuit containing active circuits, said opaque layer having an aperture therein above said second capacitor for allowing ultraviolet light to fall onto both electrodes of said second capacitor whereby the offset voltage of said amplifier can be adapted while a source of ultraviolet light is present.

2. An analog MOS inverting amplifier fabricated as a part of an integrated circuit, said amplifier having a gain of magnitude much larger than 1, including:
    an output node,
    a noninverting input node,
    an inverting input node, said inverting input node being a floating node and forming the gate of at least one MOS transistor,
    a first capacitor for coupling an input to said floating node,
    a second capacitor connected from said output node to said floating node,
    an opaque layer covering portions of the surface of said integrated circuit containing active circuits, said opaque layer having an aperture therein above said second capacitor for allowing ultraviolet light to fall onto both electrodes of said second capacitor whereby the offset voltage of said amplifier can be adapted while a source of ultraviolet light is present.

3. The amplifier of claim 2, further including means for selectively connecting together said input and said non-inverting input node.

4. The amplifier of claim 2 further including a pass gate having a first node connected to said inverting input node, a second node connected to said non-inverting input node, and a pass input.

5. A method for minimizing the input offset voltage of an MOS amplifier having a floating inverting input node, said amplifier including a capacitor having juxtaposed plates coupling the output of said amplifier to said floating input node, including the step of:
    providing ultraviolet light to said juxtaposed plates of said capacitor and allowing sufficient time for electrons excited by said ultraviolet light to equilibrate the voltage of said floating node to the voltage which would be present if said capacitor were replaced by a direct electrical connection.

6. An analog MOS differential amplifier fabricated as a part of an integrated circuit, said amplifier having a gain of magnitude much larger than 1, including:
    a non-inverting input node,
    an inverting input node,
    an output node,
    a floating node,
    a first MOS input transistor, having its gate connected to said non-inverting input node,
    a second MOS input transistor, having its gate connected to said floating node, and its source connected to the source of said first MOS input transistor,
    current source means for supplying a bias current to the source of said first and second MOS input transistors,
    current mirror means, connected to the drains of said first and second MOS N-channel input transistors, for developing an output voltage proportionate to the difference between currents flowing in the drains of said first and second MOS input transistors,
    a first capacitor having a first electrode connected to said inverting input node and a second electrode connected to said floating node,
    a second capacitor having a first electrode connected to said output node and a second electrode connected to said floating node,
    an opaque layer covering portions of the surface of said integrated circuit containing active circuits, said opaque layer having an aperture therein above said second capacitor for allowing ultraviolet light to fall onto said first and second electrodes of said second capacitor whereby the offset voltage of said amplifier can be adapted while a source of ultraviolet light is present.

7. The amplifier of claim 6, further including means for selectively connecting together said inverting input and said non-inverting input.

8. The amplifier of claim 6 further including a pass gate having a first input connected to said inverting input node, a second input connected to said non-inverting input node, and a pass input.

9. An analog MOS inverting amplifier fabricated as a part of an integrated circuit, said amplifier having a gain of magnitude much larger than 1, including:
- an input node,
- an output node,
- an MOS N-channel transistor and an MOS P-channel transistor, said MOS N-channel transistor having a source connected to a source of negative voltage, and its drain connected to the drain of said MOS P-channel transistor and to said output node, the source of said MOS P-channel transistor connected to a source of positive voltage,
- a floating gate common to said MOS N-channel transistor and said MOS P-channel transistor,
- a first MOS capacitor having a first electrode connected to said node and a second electrode comprising a portion of said floating gate,
- a second MOS capacitor having a first electrode connected to said output node and a second electrode comprising a portion of said floating gate,
- an opaque layer covering portions of the surface of said integrated circuit containing active circuits, said opaque layer having an aperture therein above said second capacitor allowing for ultraviolet light to fall onto to said first and second electrodes of said second capacitor whereby the outset voltage of said amplifier can be adapted while a source of ultraviolet light is present.

10. A circuit, integrated on an integrated circuit, including:
- an input node,
- an output node,
- a floating node,
- a first MOS analog transconductance amplifier having an inverting input connected to a source of input reference voltage, a non-inverting input connected to said input connected to a source of bias voltage,
- a second MOS analog transconductance amplifier having an inverting input connected to said floating node, a noninverting input connected to a source of output reference voltage, an output connected to the noninverting input of said first MOS analog transconductance amplifier and a bias input connected to a source of bias voltage,
- a first MOS capacitor having a first electrode connected to said output node and a second electrode connected to the inverting input of said second MOS analog transconductance amplifier,
- a second MOS capacitor having a first electrode connected to the inverting input of said second MOS analog transconductance amplifier, and a second electrode connected to the non-inverting input of said second MOS analog transconductance amplifier,
- a third MOS capacitor having a first electrode connected to the inverting input of said second MOS analog transconductance amplifier, and a second electrode connected to a source of fixed voltage,
- a fourth MOS capacitor having a first electrode connected to the inverting input of said second MOS analog transconductance amplifier, and a second electrode connected to the output of said second MOS analog transconductance amplifier, and
- an opaque layer covering portions of the surface of said integrated circuit containing active circuits, said opaque layer having an aperture therein above said fourth capacitor for allowing ultraviolet light to fall onto said first and second electrodes of said fourth capacitor.

11. The circuit of claim 10 wherein said fixed voltage is ground.

12. The circuit of claim 10, further including means for selectively connecting together said inverting input and said non-inverting input of said second MOS analog transconductance amplifier.

13. The amplifier of claim 10 further including a pass gate having a first node connected to said inverting input of said second MOS analog transconductance amplifier, a second node connected to said non-inverting input of said second MOS analog transconductance amplifier, and a pass input.

14. An analog MOS inverting amplifier fabricated as a part of an integrated circuit, said amplifier having a gain of magnitude much larger than 1, including:
- a non-inverting input node,
- an inverting input node,
- an output node,
- a floating node,
- a first MOS N-channel input transistor, having its gate connected to said non-inverting input node,
- a second MOS N-channel input transistor, having its gate connected to said floating node,
- a first current mirror including first and second MOS P-channel transistors, said first MOS P-channel transistor having its drain and gate connected to the drain of said first MOS N-channel input transistor and its source connected to a source of positive voltage, said second MOS P-channel transistor having its gate connected to the gate of said first MOS P-channel transistor, its drain connected to said output node and its source connected to said source of positive voltage,
- an MOS N-channel bias transistor having its gate connected to a source of bias voltage, its drain connected to the source of said first MOS N-channel input transistor, and its source connected to a source of negative voltage,
- a second current mirror including third and fourth MOS P-channel transistors, said third MOS P-channel transistor having its drain and gate connected to the drain of said second MOS N-channel input transistor and its source connected to a source of positive voltage, said fourth MOS P-channel transistor having its gate connected to the gate of said third MOS P-channel transistor and its source connected to said source of positive voltage,
- a third current mirror including first and second MOS N-channel current mirror transistors, said first MOS N-channel current mirror transistor having its drain and gate connected to the drain of said fourth MOS P-channel transistor, and its source connected to said source of negative voltage, said second MOS N-channel current mirror transistor having its gate connected to the gate of said first MOS N-channel current mirror transistor, its drain connected to said output node and its source connected to said source of negative voltage, a first MOS capacitor having a first electrode connected to said inverting input node and a second electrode connected to said floating node, a second MOS capacitor having a first electrode connected to said output node and a second electrode connected to said floating node, an opaque layer covering portions of the surface of said integrated circuit containing active circuits, said opaque layer having an aperture therein above said second capacitor for allowing ultraviolet light to fall onto said first and second electrodes of said second capacitor whereby the offset voltage of said amplifier can be adapted while a source of ultraviolet light is present.

15. The amplifier of claim 14, further including means for selectively connecting together said input node and said non-inverting input node.

16. The amplifier of claim 14 further including a pass gate having a first input connected to said inverting input node, a second input connected to said non-inverting input node, and a pass input.

17. An analog MOS inverting amplifier fabricated as a part of an integrated circuit, said amplifier having a gain of magnitude much larger than 1, including:

a non-inverting input node,
an inverting input node,
an output node,
a floating node,
a first MOS N-channel input transistor, having its gate connected to said non-inverting input node,
a second MOS N-channel input transistor, having its gate connected to said floating node,
an MOS N-channel bias transistor having its gate connected to a source of bias voltage, its drain connected to the source of said first MOS N-channel input transistor, and its source connected to a source of negative voltage, first and second MOS P-channel transistors, said first MOS P-channel transistor having its drain and gate connected to the drain of said first MOS N-channel input transistor and its source connected to a source of positive voltage, said second MOS P-channel transistor having its drain connected to the drain of said second MOS N-channel input transistor and its source connected to said source of positive voltage, a first MOS capacitor having a first electrode connected to said inverting input node and a second electrode connected to said floating node, a second MOS capacitor having a first electrode connected to said output node and a second electrode connected to said floating node, an opaque layer covering portions of the surface of said integrated circuit containing active circuits, said opaque layer having an aperture therein above said second capacitor for allowing ultraviolet light to fall onto said first and second electrodes of said second capacitor whereby the offset voltage of said amplifier can be adapted while a source of ultraviolet light is present.

18. The amplifier of claim 17, further including means for selectively connecting together said input node and said non-inverting input node.

19. The amplifier of claim 17 further including a pass gate having a first input connected to said inverting input node, a second input connected to said non-inverting input node, and a pass input.

* * * * *

UNITED STATES PATENT AND TRADEMARK OFFICE
CERTIFICATE OF CORRECTION

PATENT NO. : 4,935,702
DATED : June 19, 1990
INVENTOR(S) : Carver A. Mead, Timothy P. Allen It is certified that error appears in the above-indentified patent and that said Letters Patent is hereby corrected as shown below:

Column 3, line 20, after "transistor" insert --16--.

Column 4, line 8, replace "FIG. 2." with --FIG. 2--.

Column 4, line 25, replace "$C_{46}(V_f\text{-}V_2)$" with --$C_{20}(V_f\text{-}V_2)$--.

Column 5, line 23, replace "N-Channel" with --N-channel--.

Signed and Sealed this

Twenty-first Day of May, 1996

Attest:

BRUCE LEHMAN

*Attesting Officer*        *Commissioner of Patents and Trademarks*